TRANSISTOR CIRCUITRY HAVING COMBINED HEAT DISSIPATING MEANS

Filed Nov. 15, 1961

INVENTOR.
ROBERT MINTON
BY
George T. Craig
ATTORNEY

United States Patent Office 3,226,564
Patented Dec. 28, 1965

3,226,564
TRANSISTOR CIRCUITRY HAVING COMBINED HEAT DISSIPATING MEANS

Robert Minton, Plainfield, N.J., assignor to Radio Corporation of America, a corporation of Delaware Filed Nov. 15, 1961, Ser. No. 152,399
9 Claims. (Cl. 307—88.5)

The present invention relates generally to improved UHF circuits and particularly to improved semiconductor circuits wherein a heat sink for a semiconductor device also comprises an operative circuit element.

The flow of current in a transistor included in cooperation with other circuit elements produces heat which must be removed for proper operation. Produced heat has been removed in known arrangements by providing heat radiating means or, in some cases by providing a heat absorbing body to serve as a heat sink. Both of these means ultimately dissipate absorbed heat. In these known arrangements, the heat dissipating means is in excess of the transistor and its associated essential circuit elements which provide an operative device, such, for example, as an amplifier, oscillator, an electronic switch, or any other device employing a semiconductor.

An important object of the present invention is to provide an improvement in circuits employing semiconductor devices wherein a heat dissipating means combines the function of a circuit element.

Another object of the present invention is to provide a novel heat dissipating means for a semiconductor device and being constructed to serve as an impedance element in a circuit with which the semiconductor device is associated.

In general, the purposes and objects of the invention are accomplished by means of an electrically conductive heat sink connected in heat transfer relation to one of the elements, such as the collector, of a semiconductor device, such as a transistor. The heat sink is so shaped that it also provides an operative circuit element, such as an inductor in a UHF transistor circuit. In a typical embodiment of the invention the inductor is formed by a suitably formed aperture in one edge of the heat sink. The aperture boundary also may include separate closely spaced projections comprising a capacitor or connections for an external capacitive or impedance element.

Other objects and advantages of the present invention will become apparent and immediately suggest themselves to those skilled in the art to which the invention is directed from a reading of the following specification in connection with the accompanying drawing in which.

Figure 1:
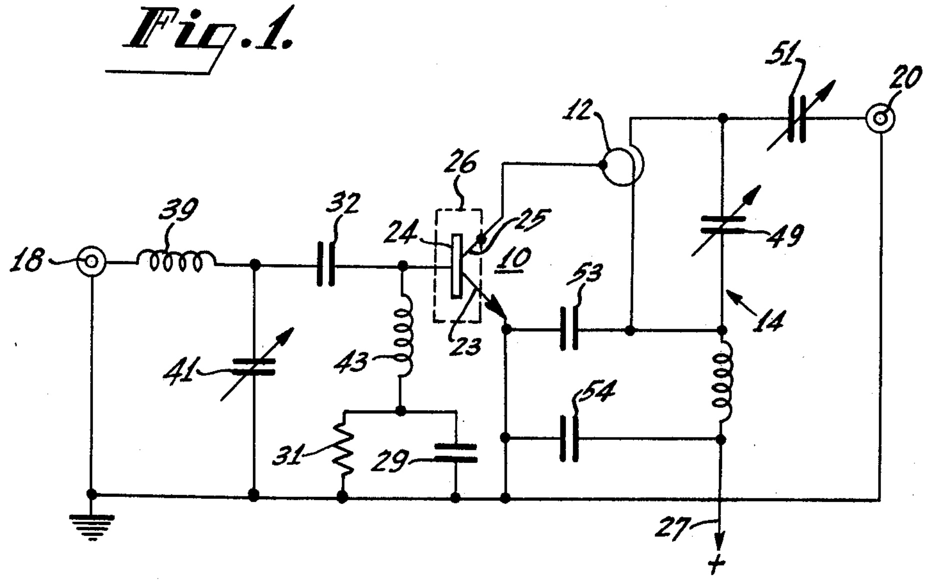
FIGURE 1 is a schematic circuit diagram of an illustrative example of the invention in which the heat dissipating means for a transistor employed in the circuit serves as a circuit element in the nature of an inductor.
Figure 2:
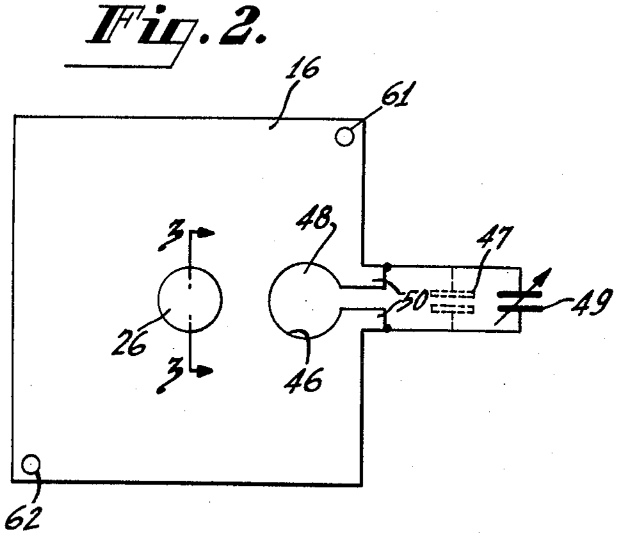
FIGURE 2 is a view in plan of heat dissipating means constructed to provide the advantages of present invention in association with and connected to an internal element of a transistor.
Figure 3:
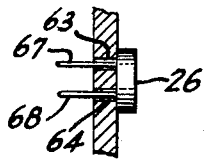
FIGURE 3 is a fragmentary transverse sectional view to an enlarged scale, the section being taken on line 3—3 of FIGURE 2.

Referring to the drawing in which the same elements are designated by the same reference characters in each of the drawing figures, FIGURE 1 shows in schematic form an example of a specific embodiment of the invention. A transistor 10 is used in an amplifier circuit in which the inductance 12 of the tank circuit 14 is provided by the construction of the heat dissipating element or heat sink 16 (FIGURES 2 and 3). While the invention is more general in character, a class C amplifier circuit is chosen as an illustrative example.

The amplifier circuit of FIGURE 1 is generally similar to known class C amplifiers having an input terminal 18 and an output terminal 20. The transistor 10 serves as an amplifier which is non-conducting or cutoff except when it is rendered conductive by driving the transistor 10 from a high frequency signal source connected to the input terminal 18. The frequency of the signal applied to the input terminal may, for example, be in the neighborhood of 200 megacycles (200 mc.).

The transistor 10 is shown, illustratively, as being of the P type conductivity, and, for example, it may be an NPN junction transistor having as electrodes an emitter 23, a base 24 and a collector 25. A type TA 2084 transistor is suitable for use as the transistor 10, particularly for high frequency use. Bias voltage for this transistor is applied to a terminal 27 so that the collector 25 is biased in the direction of least electron flow or, in other words, is biased in the reverse direction with respect to the transistor base 24. Emitter bias in a reverse direction for class C operation in the illustrative example is provided by a capacitor 29 in combination with a resistor 31 whereby the capacitor becomes changed by diode action of emitter and base as the high frequency signal from the input terminal 18 is applied by way of a capacitor 32 and the input impedance matching circuit composed of an inductance 39 and a variable capacitor 41. The charge acquired by the capacitor 29 causes the base to be biased negative with respect to the emitter so that the transistor is forward biased for less than a positive half cycle of the input signal frequency. A radio frequency choke 43 is included in circuit with the resistor 31.

The transistor 10 in the illustrative example has one of its elements, the collector in this instance, connected to the transistor case 26 (FIGURES 2 and 3). The transistor 10 is mounted in electrically and thermally conductive relationship with the heat sink 16 wherby the latter serves as a heat dissipating element and the boundary 46 of an aperature 48 provides an inductor element of one turn to serve as the inductance 12 of the tank circuit 14. This inductance in combination with capacitor 49, shown as a variable capacitor, causes the tank circuit to be tunable. In the illustrative example, the output circuit, connected between the output terminal 20 and ground is tunable by the capacitor 49. The latter is conveniently connected to projections 50 (FIG. 2) on the heat sink 16. The slot between the projections 50 may provide an inherent capacitance 47, shown schematically by dotted outline on FIG. 2. This capacitance 47 may be connected in parallel with the physical capacitor 49. A series variable capacitor 51 serves to match the amplifier to the output circuit. A radio frequency path to ground exists by way of the by pass capacitor 53. A capacitor 54 serves as a radio frequency filter or decoupling capacity for the source connected to the terminal 27.

The heat sink 16 may be associated with or connected to an instrument chassis or case (neither shown) in any suitable manner as, for example, by connecting screws or bolts inserted in the holes 61 and 62. For this purpose, insulating screws and insulating standoff sleeves of any known kind may be used. The heat sink 16 may have holes 63 and 64 to receive the connecting pins 67 and 68 of the transistor for connection to other circuit elements. In the illustrative example, of FIGURE 1, emitter and base are connected to ground and the inductor 43, respectively, the collector being connected to the heat sink 16 through the case 26.

Solely by way of example, the capacitors may have the following values:

| | $\mu\mu$f. |
|---|---|
| Capacitor **29** | 500 |
| Capacitor **41** (variable) | 7 to 100 |
| Capacitor **49** | 200 |
| Capacitor **51** | 30 to 33 |
| Capacitor **53** | 500 |
| Capacitor **54** | 500 |

Also, and by way of example, the resistor 31 may have the following value:

| | Ohms |
|---|---|
| Resistor **31** | 12 |

Further, and by way of example, the inductance 46, provided by the boundary of the aperture 48 may have a value of 0.0398 microhenry for a diameter of ¾ inch.

What is claimed is:

1. In an electronic circuit including a semiconductor device, an electrically conductive heat sink connected in heat transfer relation to said device, said heat sink being shaped to provide a frequency determining circuit element for said electronic circuit, and means for connecting said frequency determining circuit element in said electronic circuit.

2. In an electronic circuit including a transistor, said transistor having at least a base, collector and emitter electrode, an electrically conductive case for said transistor, one of electrodes being connected to said case in heat and electrically conductive relationship, an electrically conductive heat sink connected in heat transfer relation to said one of said electrodes connected to said case, said heat sink being so shaped that it provides a frequency determining circuit element for said electronic element, and means for connecting said frequency determining circuit element in said electronic circuit.

3. In an electronic circuit including a transistor, said transistor having at least a base, collector and emitter electrode, an electrically conductive case for said transistor, one of said electrodes being connected to said case in heat and electrically conductive relationship, an electrically conductive heat sink connected in heat transfer relation to said one of said electrodes connected to said case, said heat sink having an aperture whereby to provide an inductance for said electronic circuit, and means for connecting said inductance in said electronic circuit.

4. An electrically conductive heat sink comprising means for connection of said heat sink in heat transfer relation to one of the elements of a transistor connected with said means, an aperture in said heat sink whereby the boundary of said aperture provides a frequency determining circuit element for an electrical circuit connected to said transistor, and said boundary including means for connection to said electrical circuit.

5. An electrically conductive heat sink comprising means for connection of said heat sink in heat transfer relation to one of the elements of a current conducting device connected with said means, an aperture in said heat sink whereby the boundary of said aperture provides an inductive circuit element in an electrical circuit connected to said device, and separate closely spaced projections extending from said aperture in said heat sink comprising a capacitor and means for connection to said electrical circuit.

6. An electrically conductive heat sink comprising means for connection of said heat sink in heat transfer relation to one of the elements of a transistor connected with said means, said heat sink being apertured, the boundary of said aperture providing an inductance for an electrical circuit connected to said transistor, and said boundary including means for connection to said electrical circuit.

7. In combination, a transistor and a heat sink, said transistor having a base, emitter and collector electrodes enclosed in a case, a connection internally of said case from said collector to said case, a heat sink comprising a body of heat and electrically conductive material, means for connecting said case to said heat sink, said body having an aperture, means for providing electrical connections to the boundary of said aperture whereby said boundary serves as an inductance, and circuitry externally of said transistor connected to said electrical connections and to said base and emitter.

8. In an electronic circuit including a transistor, said transistor having base, collector and emitter electrodes, all of said transistor electrodes being supported by and insulated from an electrically conductive case, means connecting said collector electrode to said case in heat and electrically conductive relationship, an electrically conductive member, said member having an aperture, means for providing electrical connections to the boundary of said aperture whereby said boundary serves as an inductance, said electrically conductive member having heat dissipating properties, and said electrically conductive member being connected to the case of said semiconductor device whereby said electrically conductive member serves to dissipate heat formed in operation of said semiconductor device.

9. A class C amplifier comprising a transistor having at least a base, collector and emitter electrode, an electrically conductive case for said transistor, said collector electrode coupled to said case, an amplifier input circuit coupled to said base and emitter electrodes, a heat sink for said transistor comprising an electrically and thermally conductive member, said member having an aperture, a slot in said aperture extending from the boundary of said aperture to the boundary of said member whereby said boundary of said aperture serves as an inductance, said case coupled to said member in heat transfer and electrically conductive relation, a capacitor coupled to said aperture whereby said aperture and said capacitor serve as a tank circuit for said amplifier, and an output connection coupled to said tank circuit and said emitter.

References Cited by the Examiner

UNITED STATES PATENTS

| | | | |
|---|---|---|---|
| 2,265,958 | 12/1941 | Vilkomerson | 328—11 X |
| 2,435,984 | 2/1948 | Spencer | 333—83 X |
| 2,444,435 | 7/1948 | Fisk | 333—83 |
| 2,504,329 | 4/1950 | Heising | 333—83 X |
| 2,777,975 | 6/1957 | Aigrain | 165—47 X |
| 3,074,024 | 1/1963 | Weidknecht | 330—40 X |
| 3,095,526 | 6/1963 | Thornton | 317—235 |
| 3,108,209 | 10/1963 | Knowles | 317—234 |

ARTHUR GAUSS, *Primary Examiner.*

JOHN W. HUCKERT, *Examiner.*